June 2, 1970 J. BOHM 3,515,945

SURGE PROTECTION DEVICE

Filed April 15, 1968

INVENTOR
J. BOHM

AGENTS
Curphey & Erickson

3,515,945
SURGE PROTECTION DEVICE

John Bohm, Montreal, Quebec, Canada, assignor to Northern Electric Company Limited, Montreal, Quebec, Canada Filed Apr. 15, 1968, Ser. No. 721,495
Int. Cl. H02h *1/00, 3/22, 3/335*
U.S. Cl. 317—50 8 Claims

ABSTRACT OF THE DISCLOSURE

This invention relates to a surge protection device which uses transistors in place of the usual chain of varistors. The surge protection device, in accordance with the invention, comprises a first circuit connecting in series with identical polarities the base-collector junctions of a predetermined number of transistors and a second circuit connecting in series with identical polarities the base-emitter junctions of the same transistors. Output terminals are then connected to the base of the first and last transistors in the series.

This invention relates to varistor assemblies employed as surge protectors and click reducers and, more particularly, to the replacement of the usual chain of varistors by transistors.

Existing varistor assemblies employ back-to-back diodes connected in series in order to provide a low impedance when the voltage applied across them exceeds a predetermined value. The number of back-to-back diodes employed depends on the applied voltage. Present arrangements use diodes assembled on a board and interconnected by printed circuits.

The present invention is intended to provide a cheaper, smaller, and technologically superior product. It is based on the idea that transistors are two junction devices which can be used as two diodes. Where a large number of diodes are needed as it is the case with surge protectors and click reducers, it becomes more economical to use transistors in place of diodes. While the base area is common to two diodes in this case, the common terminal does not interfere with the function of surge protectors and click reducers if the junctions of the transistors are connected in accordance with the invention. Beside the fact that one transistor can replace two diodes thus reducing the number of components the use of transistors render the invention more suitable for integrated circuit fabrication.

The surge protection device, in accordance with the invention comprises a first circuit connecting in series with identical polarities the base-collector junctions of a predetermined number of transistors and a second circuit connecting in series with identical polarities the base-emitter junctions of the same transistors. Output terminals are then connected to the base of the first and last transistors in the series.

The invention will now be described with reference to a preferred embodiment of the invention in which.

Figure 1:
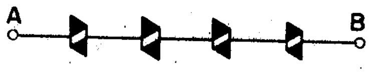
FIG. 1 illustrates a varistor assembly comprising a plurality of back-to-back connected diodes.
Figure 2:
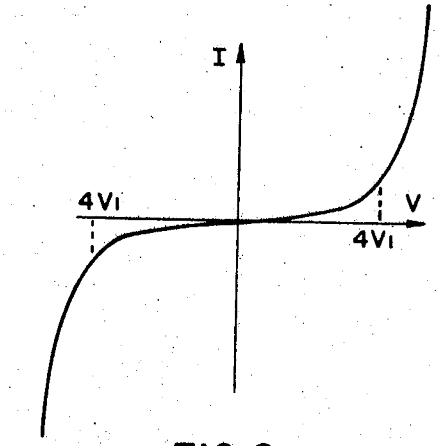
FIG. 2 illustrates the output characteristic of such varistor assembly.

FIG. 1 illustrates a varistor assembly comprising four varistors each containing two diode wafers in a single package. The back-to-back connected diodes have a symmetrical forward characteristic between terminals A and B such as illustrated in FIG. 2. Assuming that the forward voltage value at which a single diode starts to conduct is V1, the four diode combination requires four times the value V1 to achieve the same. Varistor chains are normally made of silicon material because V1 is higher for silicon (approximately 0.5 v.) than for germanium (approximately 0.3 v.) and consequently less varistors are required. However, germanium could be used.

Figure 3:
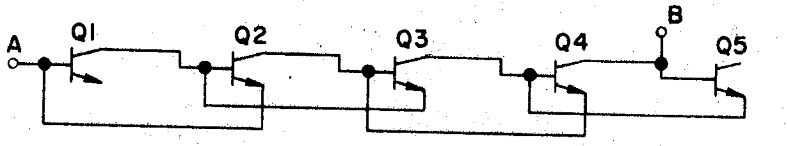
FIG. 3 illustrates a circuit in accordance with the invention using transistors in place of diodes.

FIG. 3 illustrates a circuit comprising five NPN transistors Q1–Q5 whose terminal characteristic is equivalent to the circuit of FIG. 1. The base-collector junctions of transistors Q1–Q5 are connected in series with identical polarities. Similarly the base-emitter junctions of transistors Q1–Q5 are connected in series with identical polarities. A first terminal connection A is made to the base of transistor Q1 which is connected to the emitter of Q2. Similarly a second terminal connection B is made to the base of transistor Q5 which is connected to the collector of Q4. The emitter of transistor Q1 and the collector of transistor Q5 are not connected in the circuit which means that the base-emitter junction of transistor Q1 and the base-collector junction of transistors Q5 are not used. Although NPN transistors are shown it is understood that PNP transistors could be used. Similarly the transistor material is normally silicon although germanium could also be used.

Figures 4, 5:
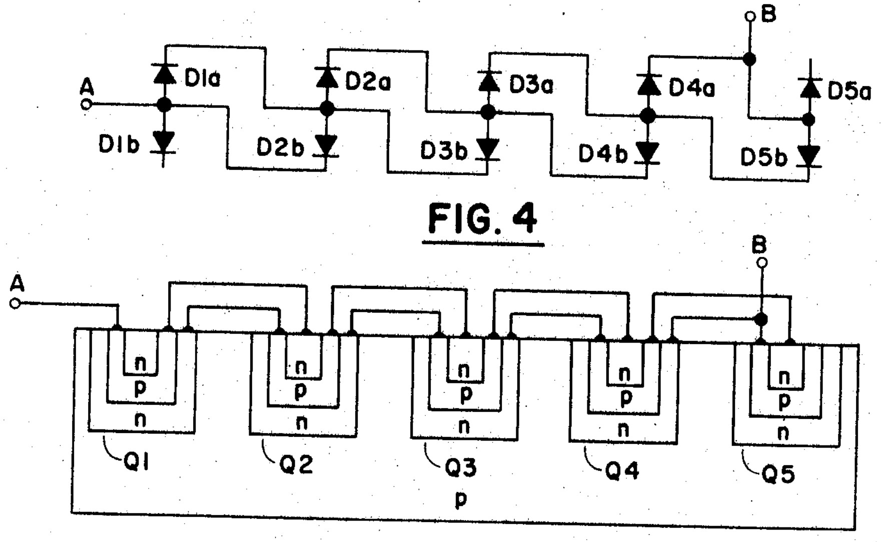
FIG. 4 illustrates the equivalent circuit of FIG. 3.
FIG. 5 illustrates a cross-section of an integrated circuit form of the invention.

FIG. 4 illustrates the equivalent circuit of FIG. 3. Diodes D1*a*–D5*a* represent the base-collector junctions of transistors Q1–Q5 while diodes D1*b*–D5*b* represent the base-emitter junctions of transistors Q1–Q5. The circuit of FIG. 4 illustrates that a circuit connection such as disclosed using five transistors in equivalent to the four varistor assembly shown in FIG. 1 provided of course that the same semi-conductive materials are used.

The circuit illustrated in FIG. 3 can be easily fabricated in monolithic integrated circuit form. FIG. 5 illustrates a cross-section of an integrated circuit wherein transistors Q1–Q5 are formed within discrete regions of a unitary body of semi-conductive material. In the embodiment shown, a p-type material is used although a n-type material could be equally used. Transistors Q1–Q5 are obtained by performing three diffusions into the p-type semiconductive material in accordance with well known diffusion techniques. After the final diffusion, ohmic contacts are made to predetermined transistor regions. The PN base-collector junctions of transistors Q1–Q5 are connected in series with identical polarities. Similarly the PN base-emitter junctions Q5–Q1 are connected in series with identical polarities. Terminal A is connected to the base area of transistor Q1 and terminal B is connected to the base area of transistor Q5. The interconnection pattern is shown in a schematic fashion above the surface of the integrated circuit. This of course can be realized by metallized patterns over an insulation layer deposited over the entire integrated circuit.

The above example shows the equivalent of a four varistor combination but this is only a simplified example. Any number of varistors can be replaced by transistors. In fact, it becomes much more economical to use transistors in place of varistors where a large number of varistors are needed because each transistor effectively replaces two diodes (except the first and last one in the series).

What is claimed is:

1. A surge protection device comprising:

(a) a series of transistors each having an emitter area, a collector area and a base area forming a base-collector and a base-emitter junction;

(b) a first circuit interconnecting in series with identical polarities the base-collector junctions of every transistor;

(c) a second interconnecting in series with identical polarities the base-emitter junctions of every transistor; and (d) terminal means connected to each of the base areas of the first and last transistors in the series.

2. A surge protection device as defined in claim 1 wherein the transistors are NPN transistors.

3. A surge protection device as defined in claim 1 wherein the transistors are made of silicon material.

4. A surge protection device as defined in claim 1 wherein the transistors are NPN silicon transistors.

5. An integrated semi-conductor surge protection device comprising:

(a) a unitary body of semi-conductive material;

(b) a plurality of discrete transistors diffused into said body of semi-conductive material, each of said transistors having a emitter region, a collector region and a base region forming a base-collector and a base-emitter junction;

(c) a first circuit interconnecting in series with identical polarities the base-collector junctions of every transistor;

(d) a second circuit interconnecting in series with identical polarities the base-emitter junctions of every transistor; and (e) terminal means connected to each of the base regions of the first and last transistors in the series.

6. An integrated semi-conductor surge protection device as defined in claim 5 wherein ohmic contacts are deposited on the exposed surface of predetermined regions of the transistors for effecting the circuit connections.

7. An integrated semi-conductor surge protection device as defined in claim 5 wherein said unitary body of semi-conductive material is made of p-type material.

8. An integrated semi-conductor surge protection device as defined in claim 5 wherein said transistors are NPN transistors.

References Cited

UNITED STATES PATENTS 3,210,620 10/1965 Lin.

3,391,311 7/1968 Lin et al.

LEE T. HIX, Primary Examiner

H. FENDELMAN, Assistant Examiner

U.S. Cl. X.R.

317—50, 61.5; 307—317